(12) United States Patent
Heidemann et al.

(10) Patent No.: US 10,775,467 B2
(45) Date of Patent: Sep. 15, 2020

(54) MAGNETIC RESONANCE METHOD AND APPARATUS FOR ECHO-PLANAR IMAGING WITH A ZIGZAG-TYPE TRAJECTORY IN RAW-DATA SPACE

(71) Applicant: Siemens Healthcare GmbH, Erlangen (DE)

(72) Inventors: Robin Heidemann, Litzendorf (DE); Patrick Liebig, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 187 days.

(21) Appl. No.: 15/830,329

(22) Filed: Dec. 4, 2017

(65) Prior Publication Data

US 2018/0156884 A1    Jun. 7, 2018

(30) Foreign Application Priority Data

Dec. 6, 2016  (DE) .......................... 10 2016 224 175

(51) Int. Cl.
*G06K 9/00*     (2006.01)
*G01R 33/561*   (2006.01)
(Continued)

(52) U.S. Cl.
CPC ....... *G01R 33/5616* (2013.01); *G01R 33/482* (2013.01); *G01R 33/4818* (2013.01);
(Continued)

(58) Field of Classification Search
CPC ........... G06T 3/20; G06T 3/40; G06T 3/4007; G06T 3/4084; G06T 5/001; G06T 11/003; G06T 11/005; G06T 11/006; G06T 2210/52; G01R 33/307; G01R 33/44; G01R 33/4625; G01R 33/48; G01R 33/4818;
(Continued)

(56) References Cited

U.S. PATENT DOCUMENTS

| 5,672,969 A * | 9/1997 | Zhou ................ G01R 33/56572 324/309 |
| 6,560,353 B1 * | 5/2003 | Haacke ................ G01R 33/561 382/128 |

(Continued)

OTHER PUBLICATIONS

Scott B. Reeder et al., "Iterative Decomposition of Water and Fat With Echo Asymmetry and Least-Squares Estimation (IDEAL): Application With Fast Spin-Echo Imaging", Magnetic Resonance in Medicine, 54, 2005, pp. 636-644. (Year: 2005).*

(Continued)

*Primary Examiner* — Eric Rush
(74) *Attorney, Agent, or Firm* — Schiff Hardin LLP

(57) ABSTRACT

In a method and magnetic resonance (MR) apparatus for echo-planar MR imaging with which MR signals are entered in raw-data space with a zigzag-type trajectory, a sequence of readout gradients and phase-encoding gradients is applied such that a zigzag-type undersampled trajectory in raw-data space is filled, such that with the signal echoes being shifted by up to a quarter of the acquired raw-data space in the direction of the readout axis. Image data are reconstructed using a parallel-imaging reconstruction algorithm that operates on the raw data acquired in the zigzag-type trajectory, based on an interlaced Fourier transform.

15 Claims, 6 Drawing Sheets

(51) Int. Cl.
  *G01R 33/48* (2006.01)
  *G06T 3/40* (2006.01)
  *G01R 33/56* (2006.01)
  *G06T 11/00* (2006.01)

(52) U.S. Cl.
  CPC ......... *G01R 33/4824* (2013.01); *G01R 33/56* (2013.01); *G01R 33/561* (2013.01); *G01R 33/5608* (2013.01); *G01R 33/5611* (2013.01); *G06T 3/4007* (2013.01); *G06T 3/4084* (2013.01); *G06T 11/005* (2013.01); *G06T 11/006* (2013.01); *G06T 2210/52* (2013.01); *G06T 2211/40* (2013.01)

(58) Field of Classification Search
  CPC ............. G01R 33/482; G01R 33/4824; G01R 33/483; G01R 33/54; G01R 33/56; G01R 33/5608; G01R 33/561; G01R 33/5611; G01R 33/5616; G01R 33/5619; G01R 33/56545; A61B 5/055; A61B 5/7242; A61B 5/7257
  USPC ....... 382/128, 131, 254, 275–277, 280, 293, 382/295, 298–300; 324/307–310, 312; 600/407, 410
  See application file for complete search history.

(56) References Cited

U.S. PATENT DOCUMENTS

| | | | | |
|---|---|---|---|---|
| 7,592,808 B1 * | 9/2009 | King | ................ | G01R 33/56545 324/307 |
| 7,941,204 B1 * | 5/2011 | Wang | ................ | G01R 33/4824 600/420 |
| 8,089,278 B1 * | 1/2012 | Du | ................ | G01R 33/4824 324/307 |
| 8,570,034 B2 * | 10/2013 | Stemmer | ............... | G01R 33/246 324/307 |
| 9,234,953 B2 * | 1/2016 | Labadie | ............. | G01R 33/4818 |
| 10,185,014 B2 * | 1/2019 | Grodzki | ............... | G01R 33/307 |
| 10,209,331 B2 * | 2/2019 | Bieri | ................. | G01R 33/4824 |
| 2004/0204643 A1 * | 10/2004 | Jesmanowicz | ... | G01R 33/56341 600/410 |
| 2008/0024132 A1 * | 1/2008 | Brau | ................. | G01R 33/5611 324/309 |
| 2008/0068016 A1 * | 3/2008 | Gaddipati | .......... | G01R 33/4824 324/318 |
| 2009/0072826 A1 * | 3/2009 | Hargreaves | ........ | G01R 33/4828 324/309 |
| 2011/0148410 A1 * | 6/2011 | Zaitsev | .............. | G01R 33/5611 324/309 |
| 2014/0197834 A1 * | 7/2014 | Porter | ................ | G01R 33/4818 324/309 |
| 2014/0266191 A1 * | 9/2014 | Sveinsson | ........ | G01R 33/56563 324/309 |
| 2015/0253408 A1 | 9/2015 | Grodzki et al. | | |

OTHER PUBLICATIONS

Sekihara et al: "New Reconstruction Technique for Echo-Planar Imaging to Allow Combined Use of Odd and Even Numbered Echoes", Magnetic Resonance in Medicine 5, pp. 485-491; (1987).

* cited by examiner

MAGNETIC RESONANCE METHOD AND APPARATUS FOR ECHO-PLANAR IMAGING WITH A ZIGZAG-TYPE TRAJECTORY IN RAW-DATA SPACE

BACKGROUND OF THE INVENTION

Field of the Invention

The present invention concerns a method for echo-planar MR imaging with which MR signals are acquired with a zigzag-type trajectory in the raw-data space (k-space). The invention further relates to a magnetic resonance apparatus and an electrically readable data storage medium for implementing such a method.

Description of the Prior Art

High-speed recording methods using the EPI (echo-planar imaging) principle are known in magnetic resonance tomography (MRT). One EPI recording technique uses the so-called zigzag trajectory with which continuous phase encoding is used with simultaneous sinusoidal readout gradients. This technique has the advantage of producing less noise when recording MR signals, and achieves a shorter echo time as a result of the more effective, continuous data recording. However, with such continuous phase encoding, the data points are not arranged on a Cartesian grid in k-space, which is a basic prerequisite for reconstructing image data from the k-space data using a reconstruction algorithm of the type employed in Cartesian parallel acquisition imaging, such as GRAPPA (generalized autocalibrating partially parallel acquisition). Known from DE 10 2013 100 349 A1 is the use of a phase encoding that makes the data lie on a mathematically correct zigzag trajectory. It is also possible to select other forms; they only need to be an exactly scaled amount of the readout gradient.

It is possible to reconstruct image data from the, on-average, non-undersampled MR data by the use of an interlaced Fourier transform (iFT). With undersampled, i.e. accelerated, data acquisition, it is no longer possible to reconstruct the data with iFT. In such a case, it is necessary to use a GRAPPA reconstruction taking account of the fact that, with an assumed acceleration factor of 2 in the acquisition, the GRAPPA reconstruction has to be used with a reconstruction factor of 4. This is due to the fact that the GRAPPA reconstruction is applied separately in the even or odd k-space lines in the raw-data space. These separated datasets are now two-fold undersampled for a non-accelerated recording. For a two-fold accelerated recording, the data are already undersampled fourfold. The higher reconstruction factor in the GRAPPA reconstruction results in an increase in the g factor, which, together with the acceleration factor for the acquisition, describes the signal-to-noise loss caused by the parallel imaging reconstruction. If additional data are reconstructed from undersampled data by the use of a parallel imaging reconstruction algorithm, there is now a region with twofold undersampling in the middle of the k-space lines. This means that it is not possible to combine the GRAPPA reconstruction with an acceleration factor and to use iFT.

SUMMARY OF THE INVENTION

An object of the present invention is to use an accelerated recording with the use of parallel imaging techniques while simultaneously not increasing the noise in the recorded MR image to an excessive degree.

In the method for echo-planar MR imaging according to the invention, MR signals are entered in raw-data space along a zigzag-type trajectory. In accordance with the invention, MR raw-data points are recorded with a sequence of readout gradients and phase-encoding gradients that cause a zigzag-type undersampled trajectory in the acquired raw-data space.

The acquisition is performed such that the signal echoes are shifted by up to a quarter of the acquired raw-data space in the direction of the readout axis. Furthermore, an additional zigzag-type trajectory in the acquired raw-data space is reconstructed by a parallel-imaging method, and using the acquired zigzag-type trajectory. Then, at least one MR image is reconstructed using interlaced Fourier transform (iFT).

Shifting the signal echoes by up to a quarter of the acquired raw-data space in the direction of the readout axis causes the signal echoes to occur in a region of the raw-data space in which the spacing of the trajectories in the phase-encoding direction correspond to one $\Delta k_y$. This means that a new raw-data center is present at a location where the sampling has taken place densely enough for the performance of a reconstruction using iFT. As is known, $\Delta k_y$ is proportional to the integral over the gradient along the phase-encoding axis, multiplied by the time in which the gradient is present. The difference between two trajectories in the direction of the phase-encoding axis is now less than one $\Delta k_y$, which means that the Nyquist theorem is satisfied here. If the echo is shifted by less than a quarter, the raw-data center is present in a region in which the spacing between two points in the phase-encoding direction is alternately smaller and greater than the minimum spacing required by the Nyquist theorem for reconstruction without aliasing. This means that the average spacing between adjacent points in the phase-encoding direction corresponds to the Nyquist criterion and the data can be reconstructed successfully.

Preferably, before the reconstruction of the at least one MR image, the raw data in the raw-data space are extended such that an extension segment is formed, this extension taking place with the application of a point symmetry in the raw-data space with respect to the raw-data center, so as to create an extended raw-data space encompassing the acquired raw-data space and the extension segment. The raw data in the extension segment are calculated using point reflection at the raw-data center.

The raw data in the extension segment can be determined using the so-called zero-filling technique or with the partial Fourier technique.

The signal echoes can be shifted in the direction of a readout axis by shortening or lengthening the dephasing pre-gradient before the signal readout. In the case of a reduced dephasing pre-gradient, signals occur earlier than in the case where the signal echo occurs in the middle of a readout window. Here, the signal echoes are shifted in a first direction of the readout axis, for example by a quarter. The extension segment then also lies in the first direction of the readout axis relative to the acquired raw-data space.

One iFT can, for example, be applied to the acquired raw-data space to create a hybrid space and one iFT can be applied to the extension segment to create a hybrid extension segment, wherein the hybrid space and the hybrid extension segment are merged to represent a total hybrid space. This total hybrid space can be subjected to a Fourier transform along this axis to create the at least one MR image.

The use of the extension segment provides two possibilities. In a first possibility, the recording time is reduced while the resolution remains constant, with the other possibility, the recording time is left the same and the resolution is increased in the direction of the readout axis. With the first possibility, this is achieved in that the at least one MR image that is reconstructed has a desired resolution, wherein the recording time required for the desired resolution of the at least one MR-image is reduced in that the raw-data space required for the desired resolution is not completely recorded. The raw-data space required for the desired resolution corresponds to the extended raw-data space with the extension segment. Since only a partial area was acquired in the extended raw-data space, the recording time is shorter than with a recording with which the entire extended raw-data space with MR signals was acquired for the desired resolution.

In the second option with the increased resolution, the MR image is recorded with a defined recording time, wherein the raw data recorded in the defined recording time without using the extension segment can be used to reconstruct an MR reference image with a defined resolution. The MR image reconstructed with the iFT using the extension segment then has higher resolution than the defined resolution, namely higher resolution in the direction of the readout axis.

The reconstruction of the additional zigzag-type trajectory is preferably performed using the GRAPPA method. However, it is possible to use other methods. It is generally possible to use Cartesian parallel-imaging methods, for example SENSE (SENSitivity Encoding).

The additional zigzag-type trajectory can be reconstructed such that an incline of the last segment of the acquired zigzag-type trajectory in the direction of the positive phase-encoding direction has an opposite preliminary sign than an incline of the last segment of the reconstructed zigzag-type trajectory in the direction of the positive phase-encoding direction. In other words, this means that the acquired trajectory and the reconstructed trajectory end or start at opposite corners of the raw-data space in the phase-encoding direction.

Furthermore, the invention encompasses a magnetic resonance apparatus with an image-sequence controller that operates an MR data acquisition scanner of the apparatus so as to produce the zigzag-type trajectory, and a computer for the reconstruction of the at least one MR image as described in detail above and below.

The present invention also encompasses a non-transitory, computer-readable data storage medium encoded with programming instructions that, when the storage medium is loaded into a computer of a magnetic resonance apparatus, cause the computer to operate the magnetic resonance apparatus according to any or all of the embodiments of the method according to the invention, as described above.

The above-described features and features described below can be used not only in the corresponding explicitly described combinations, but also in further combinations, unless expressly stated otherwise, or individually, without departing from the scope of protection of the present invention.

DESCRIPTION OF THE PREFERRED EMBODIMENTS

Figure 1:
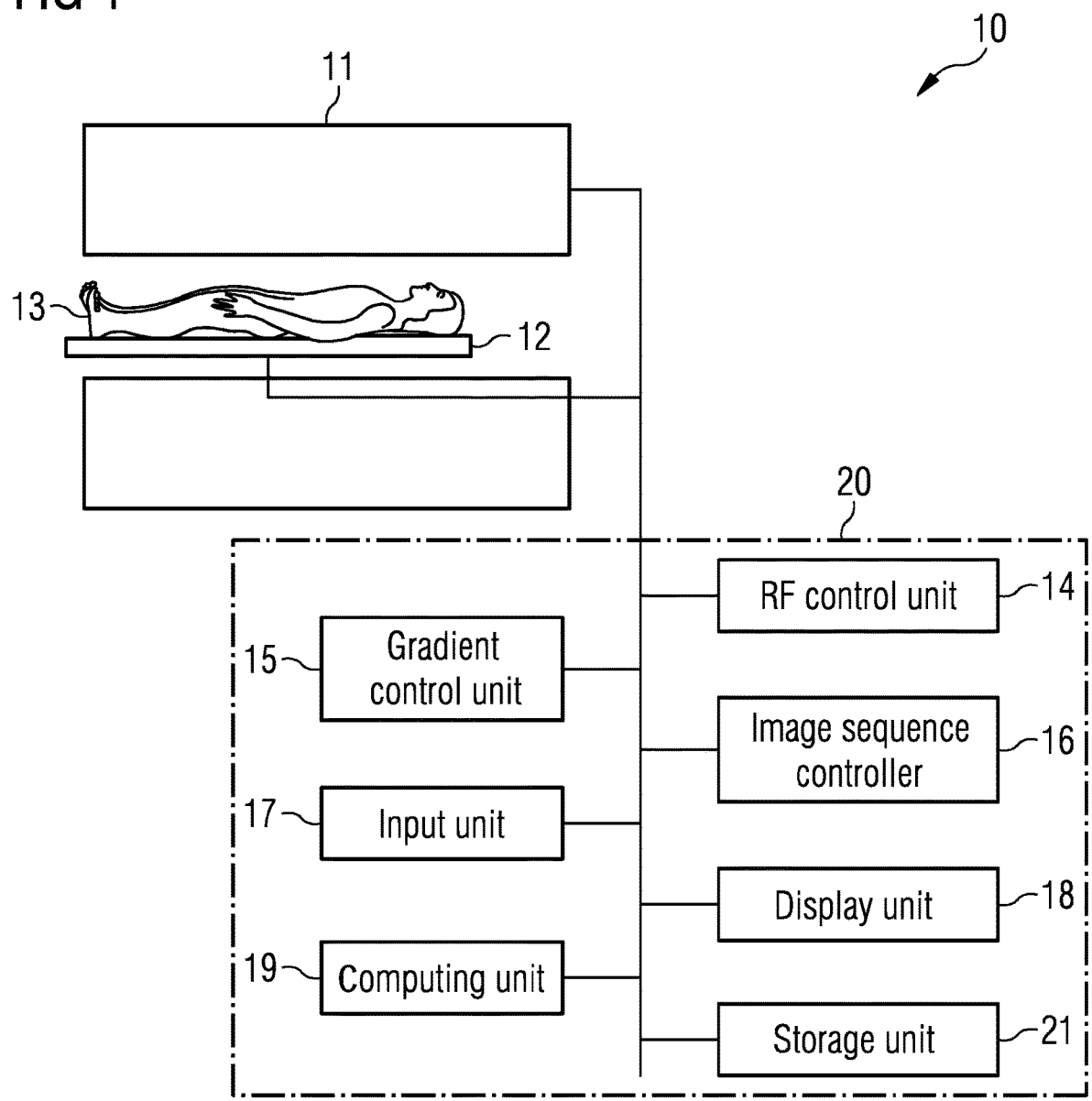
FIG. 1 schematically illustrates an MR apparatus with which MR images can be calculated according to the invention.

The following describes the present invention with reference to preferred embodiments and also with reference to the drawings. In the figures, the same reference characters identify the same or similar elements. Furthermore, the figures are schematic representations of different embodiments of the invention. Elements depicted in the figures are not necessarily depicted true-to-scale. Instead, the elements shown in the figures are reproduced such that their function and purpose are understandable to the person skilled in the art. The links between functional units or other elements depicted in the figures can also be implemented as indirect links, wherein a link can be wireless or hardwired. Functional units can be implemented as hardware, software or a combination of hardware and software.

With reference to FIG. 1, an MR apparatus 10 is explained with which, as explained below, MR images are recorded with echo-planar imaging and undersampling, wherein, despite the undersampling, artifact-free images are generated. The MR apparatus 10 has a scanner 11 that has a basic field magnet that generates a polarization field B0. An examination subject 13 on a bed 12 is moved into the scanner 11 in order to record spatially encoded magnetic resonance signals from the examination subject 13. The coils used for signal recording, such as a whole-body coil or local coils are not depicted, for clarity. The invention can be applied with so-called parallel imaging with which the MR signals are recorded simultaneously with multiple local coils, i.e. a coil array or local coils. The radiation of radio-frequency pulses and switching of magnetic field gradients can cause the magnetization generated by the polarization field B0 to be deflected out of the equilibrium position and spatially encoded and the resulting magnetization is detected by the receiver coils. Methods for generating MR images by radiating the RF pulses and switching magnetic field gradients in different combinations and sequences of MR images are in principle known to those skilled in the art, and so need not be explained in further detail herein.

The MR apparatus furthermore has a control computer 20 that controls the MR apparatus 10. The control computer 20 has a gradient controller 15 for controlling and switching the necessary magnetic field gradients. An RF controller 14 is provided to control and generate the RF pulses for deflecting the magnetization. An image-sequence controller 16 controls the sequence of magnetic field gradients and RF pulses and hence indirectly the gradient controller 15 and the RF controller 14. An operator can control the MR apparatus 10 via an input unit 17 and MR images and other information required for the control can be displayed on a display monitor 18. A computing unit 19 with at least one processor (not shown) is provided to control the different units in the control computer 20. Furthermore, a memory 21 is provided in which program modules or programs can be stored, which, when they are executed by the computing unit 19 or its processor, control the operation of the MR apparatus 10. As explained below, the computing unit 19 is designed to calculate, according to the invention, MR images from the acquired MR signals such that undersampling is possible with a zigzag trajectory, wherein simultaneously a substantially artifact-free reconstruction with a satisfactory signal-noise ratio of the MR images is achieved.

As explained in detail below, a combination of interlaced Fourier transform (iFT) and parallel-imaging requires the accelerated data to be recorded such that, following a parallel image reconstruction, the condition for iFT are satisfied. This condition is that the spacing of the raw data around the center of raw-data space, i.e. k-space, causes the Nyquist theorem to be satisfied, or in other words is smaller or equal to $\Delta ky$ is. There are two ways to achieve this. The first possibility is to record only ⅔ in the readout direction of raw-data space or k-space. This shortens the recording time and, following a partial Fourier reconstruction in the readout direction of a readout axis, produces the same resolution as that originally desired for the k-space. The k-space center is then shifted so as to be located in a region in which the Nyquist criterion is satisfied. Another possibility for achieving this condition is to keep the recording time the same and to shift the recorded k-space by changing the pre-gradient in the direction of the readout axis. Since in this embodiment the position of the k-space center does not change, k-space is ultimately sampled asymmetrically. This again has the result that the k-space center is located on a region in which the Nyquist criterion is satisfied.

Figure 2:
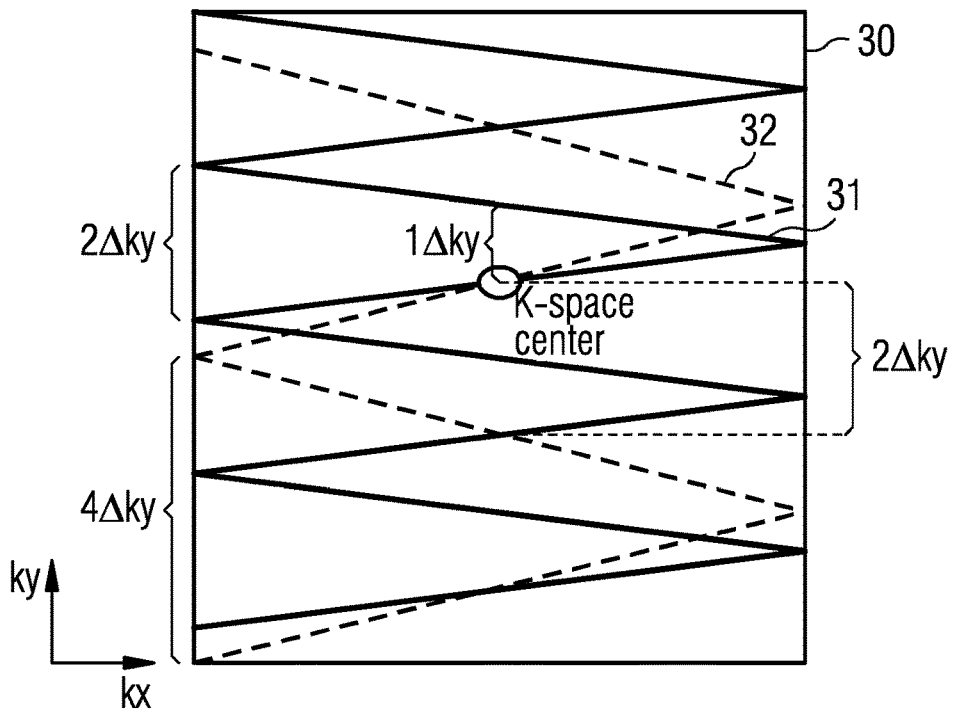
FIG. 2 schematically illustrates raw-data space and the relationship between zigzag-type trajectories and the spacing between those trajectories.
Figure 3:
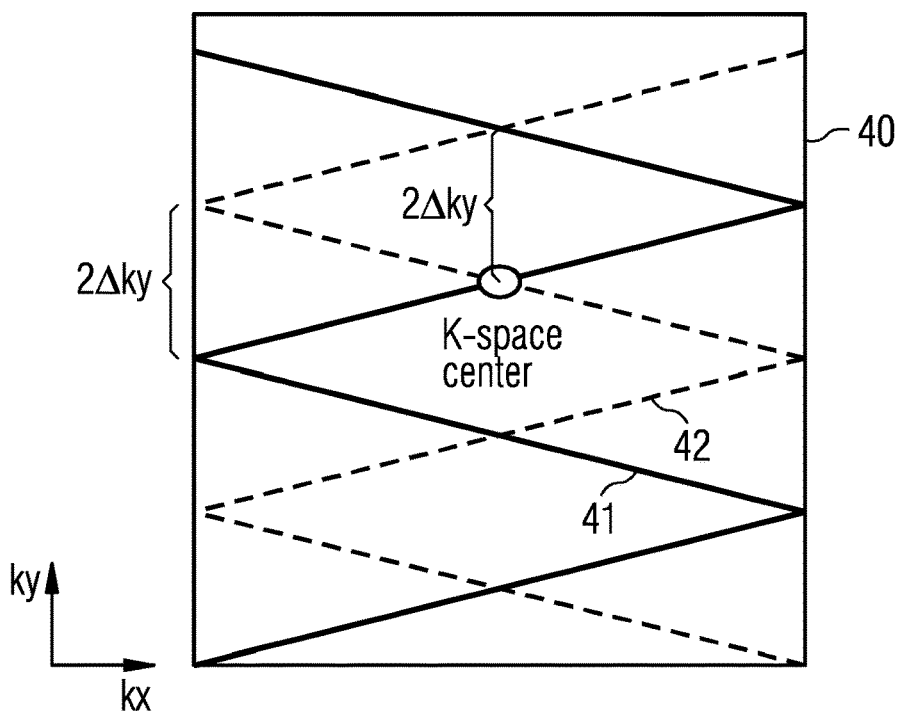
FIG. 3 schematically illustrates an example of raw-data space with a recorded and reconstructed trajectory, wherein image data cannot be reconstructed from the raw-data space shown in FIG. 3 without artifacts.

In connection with FIGS. 2 and 3, an explanation is given of the conditions and trajectories with which artifact-free reconstruction of an MR image using the iFT is possible or not possible. Herein, it is necessary to take account of the fact that, with artifact-free reconstruction in particular account is taken of the loudness of the noise in the generated MR image. In the following discussion, it is assumed that, with a spacing of raw-data segments of the zigzag trajectory, the Nyquist theorem is satisfied when the spacing in the direction of the phase-encoding axis is 1 $\Delta ky$ (one times $\Delta ky$). 2 $\Delta ky$ (two times $\Delta ky$) means simple undersampling, etc. FIG. 2 depicts a raw-data space 30 in the kx and ky directions, wherein kx is the readout axis and ky the phase-encoding axis, wherein a recorded trajectory 31 fills this raw-data space. The maximum spacing in the center of the raw-data space is 1 $\Delta ky$, while at the edge it is 2 $\Delta ky$. This raw dataset can be reconstructed with the iFT such that the signal-noise ratio is satisfactory and no substantial artifacts occur; this will be described as artifact-free below. Furthermore, a dashed line indicates a raw data-zigzag trajectory 32 with which the recording was made with an acceleration factor of 2, i.e. simple undersampling. As can be identified, the individual segments of the trajectory 32 have a spacing of 2 $\Delta ky$ in the middle and a maximum spacing of 4 $\Delta ky$ at the edge. This dataset 32 cannot be reconstructed to form an image without artifacts with the iFT.

FIG. 3 depicts raw-data space 40 with a recorded zigzag trajectory 41. As known to the person skilled in the art, the zigzag-type trajectory takes place via a periodically switched readout gradient and via a phase-encoding gradient corresponding to the absolute value of the readout gradient with a correspondingly lower amplitude. The trajectory was recorded with an acceleration factor of 2, i.e. only 50% of the raw data was recorded, while the trajectory 42 was reconstructed with parallel imaging techniques, for example GRAPPA. This raw dataset depicted in FIG. 3 cannot be reconstructed to form an image without artifacts with the iFT since the maximum spacing is 2 $\Delta ky$ in the center and 2 $\Delta ky$ at the edge. A further problem is that the points of intersection in the central raw-data region lead to artifacts with the iFT. Artifact-free reconstruction would require a further GRAPPA reconstruction.

Figure 4:
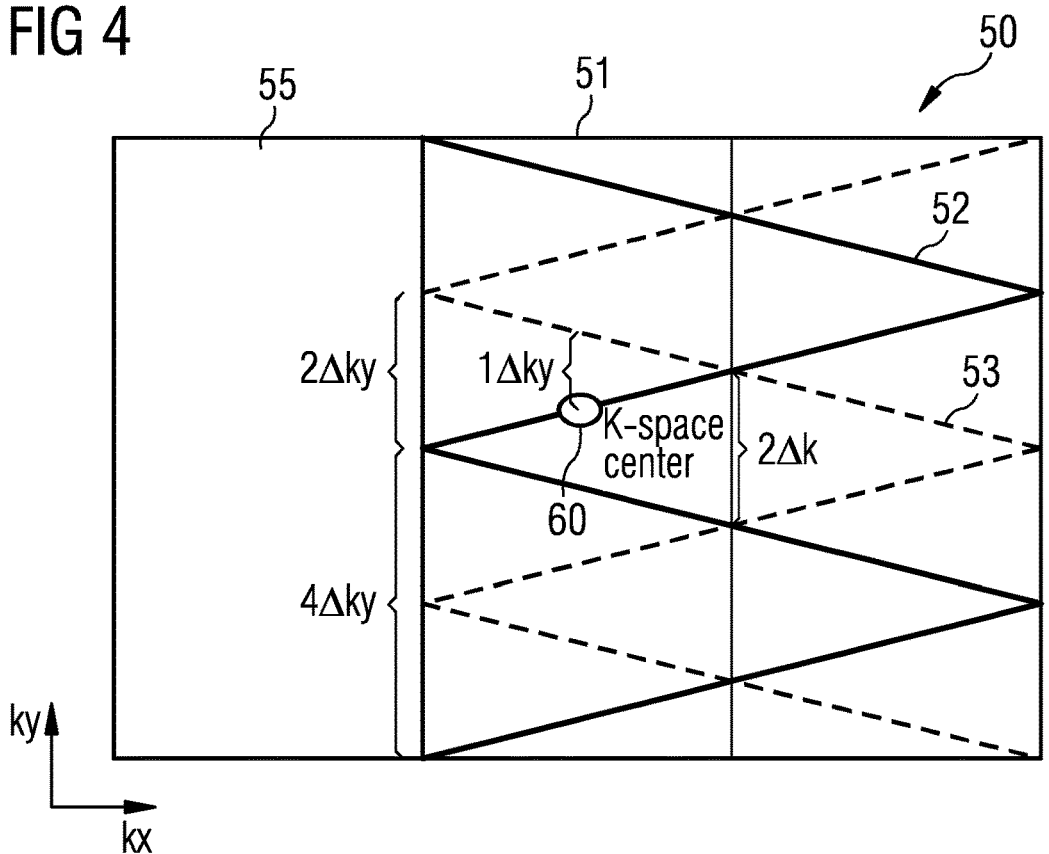
FIG. 4 shows an example of raw-data space, which is filled with zigzag-type trajectories by extension in the readout direction, such that artifact-free reconstruction of an MR image is possible with undersampling.

FIG. 4 depicts raw-data space with which the reconstruction takes place such that artifact-free reconstruction of MR images is possible even with undersampling with a factor of 2. The raw-data space has an acquired raw-data space 51 in which a zigzag-type trajectory 52 was recorded as depicted. Reducing the dephasing pre-gradient relative to the gradient during the readout time causes the signal echo to occur earlier and not in the geometric center of the acquired raw-data space, but in the raw-data center 60. Furthermore, in the example depicted, similarly to in FIG. 3, an additional zigzag-type trajectory 53 is calculated, for example using GRAPPA reconstruction. With this acquired raw-data space, the maximum spacing is 2 $\Delta ky$ in the center and at the edge so that, as explained in connection with FIGS. 2 and 3, artifact-free reconstruction is not possible. According to the invention, raw-data space is now read out asymmetrically and it is possible for an extended raw-data space to be formed, two thirds of which are the acquired raw-data space 51 and one third is an extension segment 55. The extended raw-data space 50 now includes the acquired raw-data space 51 and the extension segment 55. The raw-data points in the extension segment 55 can be determined by so-called zero filling or with partial Fourier. This uses the point symmetry of the extended raw-data space. The raw-data center 60 is used for this. The raw-data points in the extension segment 55 are calculated by point reflection at the raw-data center 60. If the extended raw-data space 50 is now considered, it is identifiable that the spacing is only 1 $\Delta ky$ in the raw-data center while it is maximum 2 $\Delta ky$ at the edge. Furthermore, the points of intersection of the individual zigzag-type trajectories are not in the raw-data center 60. This enables artifact-free reconstruction with the extended raw-data space 50 with the iFT. Hence, it is possible to record a two-fold accelerated MR image with echo-planar imaging using a GRAPPA reconstruction.

Figure 5:
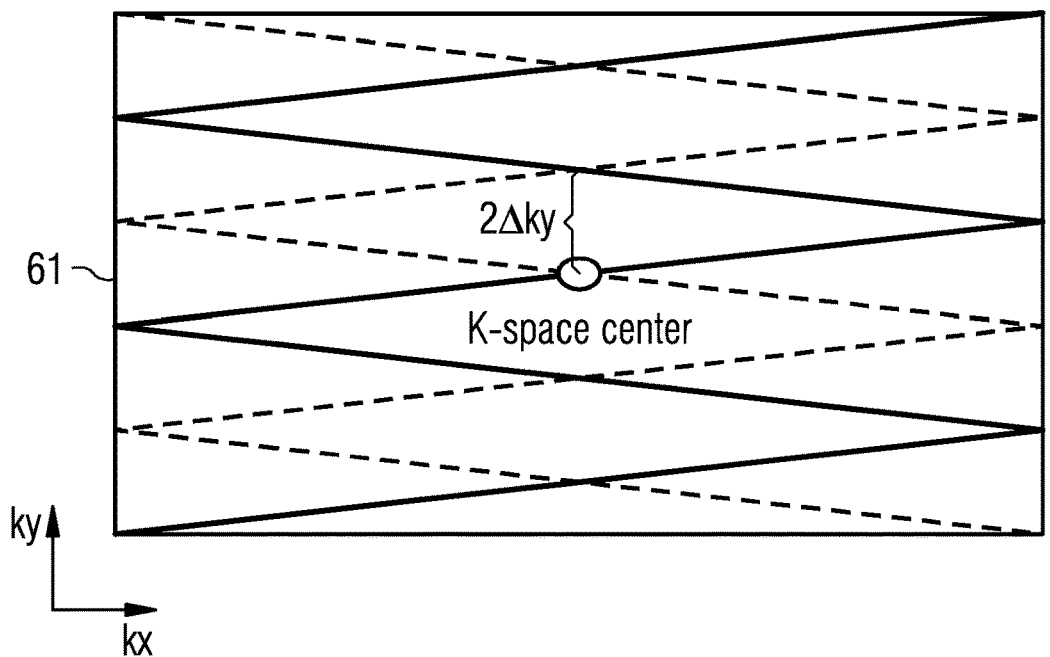
FIG. 5 shows an example of raw-data space, which was completely recorded, but with which artifact-free reconstruction is not possible with undersampling.

A raw-data space 61 depicted in FIG. 5 has the same extension in the direction of the readout axis kx as the acquired raw-data space 51 in FIG. 4. However, it is identifiable that, both in the raw-data-space center or k-space center and also at the edge, the maximum spacing of the segments of a trajectory is 2 $\Delta ky$ so that here once again artifact-free reconstruction is not possible. Artifact-free reconstruction is not possible without shifting the signal echoes.

Figure 6:
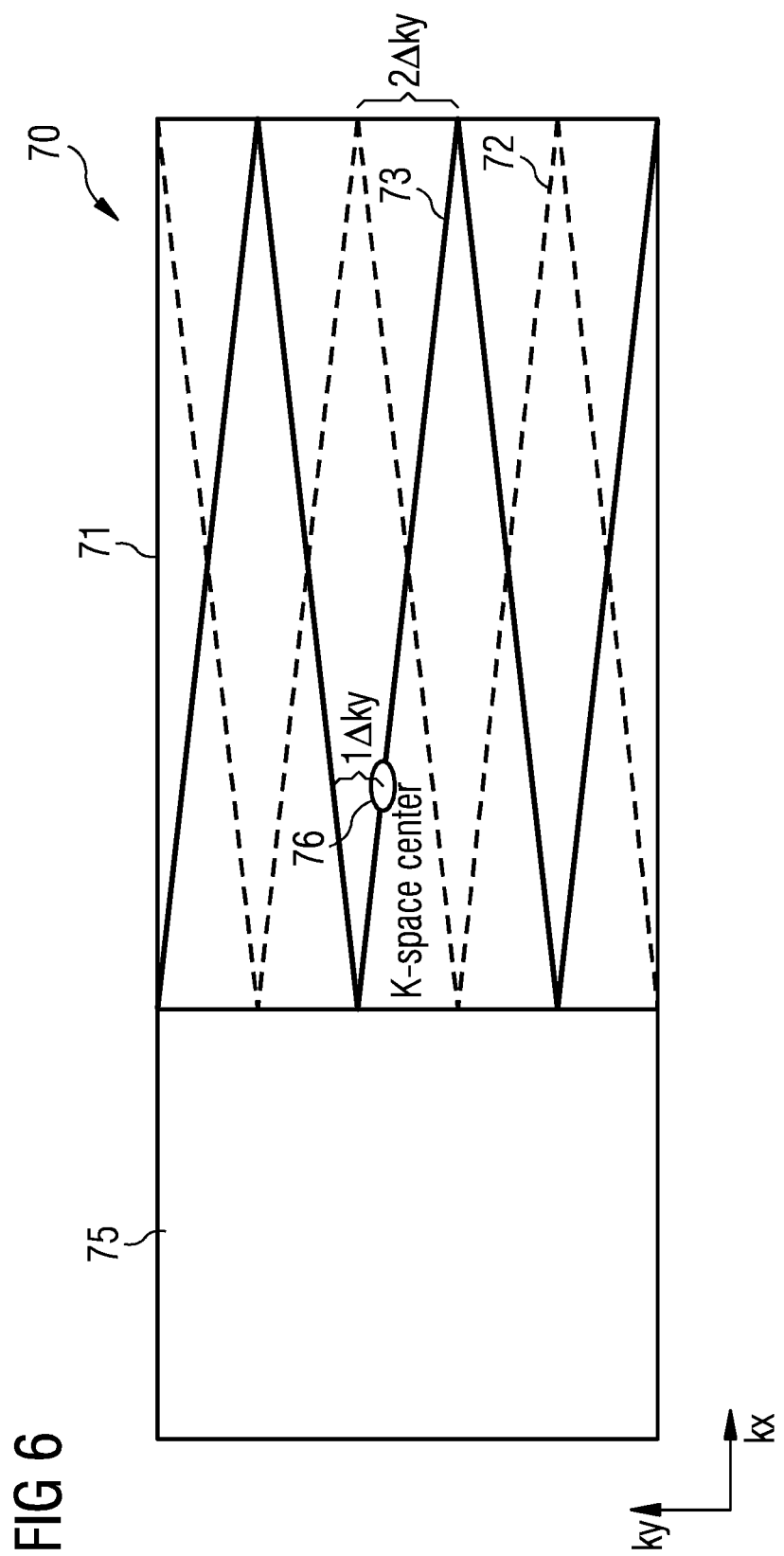
FIG. 6 shows the recording of raw-data space with which, with a given recording time, the resolution can be increased by extension in the readout direction.

FIG. 6 depicts an embodiment similar to that in FIG. 4, wherein once again raw-data space is divided into a recorded raw-data space 71 and an extension segment 75 in the readout direction. The length of the acquired raw-data space 71 with the acquired trajectory 73 and the reconstructed trajectory 72 once again corresponds to the length of the raw-data space 61 in FIG. 5. The asymmetrical signal readout and the extension with point reflection about the center 76 in the kx direction with filling in the extension segment 75 again causes the raw-data space to be changed such that there is a maximum spacing of 1 Δky in the raw-data center, while the maximum spacing at the edge is 2 Δky. Hence, the extended raw-data space 70 can be reconstructed artifact-free. The recording time is the same as with the recording of the raw-data space in FIG. 5, but the resolution is higher in the kx direction than it is in an MR image calculated with the raw-data space in FIG. 5.

Figure 7:
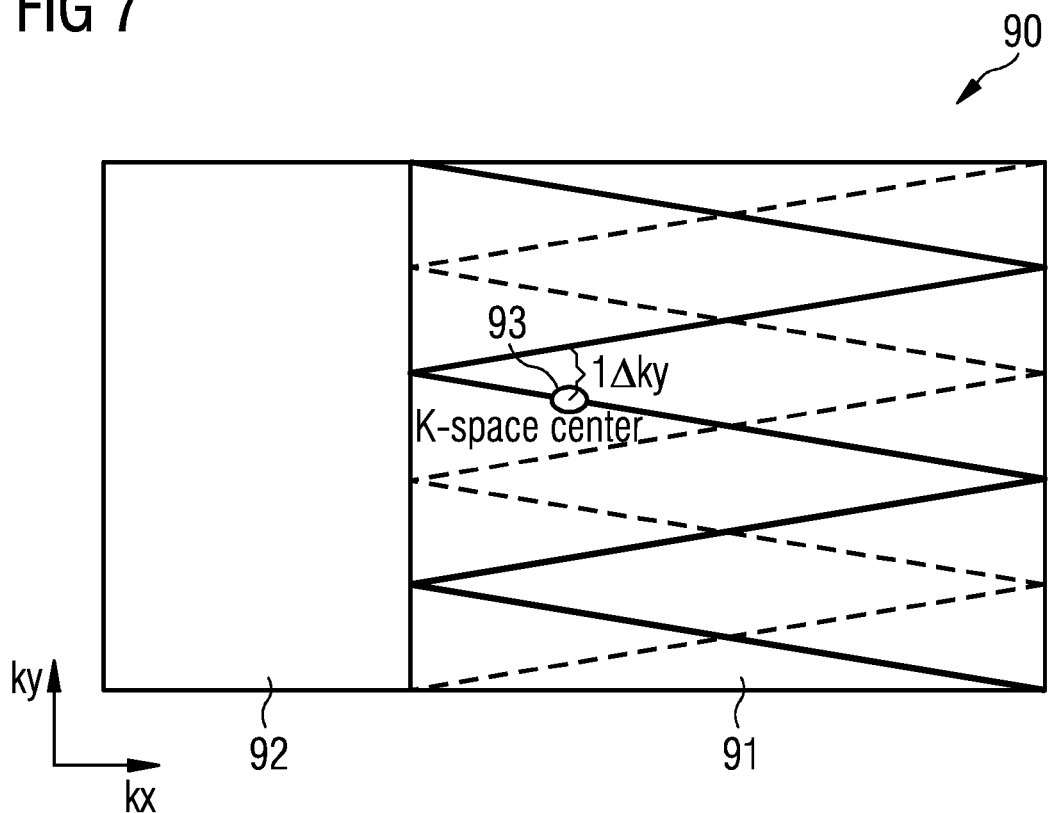
FIG. 7 shows the recording of raw-data space with which the recording time can be reduced while the resolution remains constant.

The present invention enables the recording of raw-data points with undersampling using continuous phase encoding. With this continuous phase encoding, the raw-data points do not lie on a Cartesian grid, but this is a perquisite for the use of Cartesian parallel imaging such as GRAPPA. As a result of the extension in the kx direction and asymmetric acquisition, the k-space center is no longer located in the middle of the acquired raw-data space as a result of which, first, the maximum spacing of the raw-data points is reduced and, furthermore, the points of intersection of the individual segments of the trajectory are not located in the raw-data center. It is now possible, for example, only to perform an iFT in the segment with the k-space center in order to obtain an image. It is additionally possible to generate an image by using iFT in the extension segment primarily containing radio-frequency k-space information. This image could be combined with the first image in order to increase the resolution. A further possibility consists in not increasing the resolution, but recording less data in the kx direction. In this case, the recording time would be shorter than with a completely sampled raw-data space. The missing segment, the extension segment, can be replaced either by zero filling or by a partial Fourier reconstruction from the data of the two recorded segments, since the data is point-symmetric with respect to the k-space center. This embodiment is described in FIG. 7. The entire raw-data space 90 depicted in FIG. 7 has the same extension in the kx direction as the acquired raw-data space 71. However, unlike the case with the acquired raw-data space 71, only the raw-data space 91 is acquired and the raw data in the extension segment 92 is reconstructed using the point symmetry and point reflection at the raw-data center 93. Unlike the case with the recorded raw-data space 71, now the same resolution is achieved in the kx direction as with an MR image that was only achieved using the acquired raw-data space 71, but the recording time is shorter in this case. In FIG. 7, a shorter signal readout time is used with each signal echo than with the embodiment in FIG. 6 and thus the overall recording time is reduced.

Figure 8:
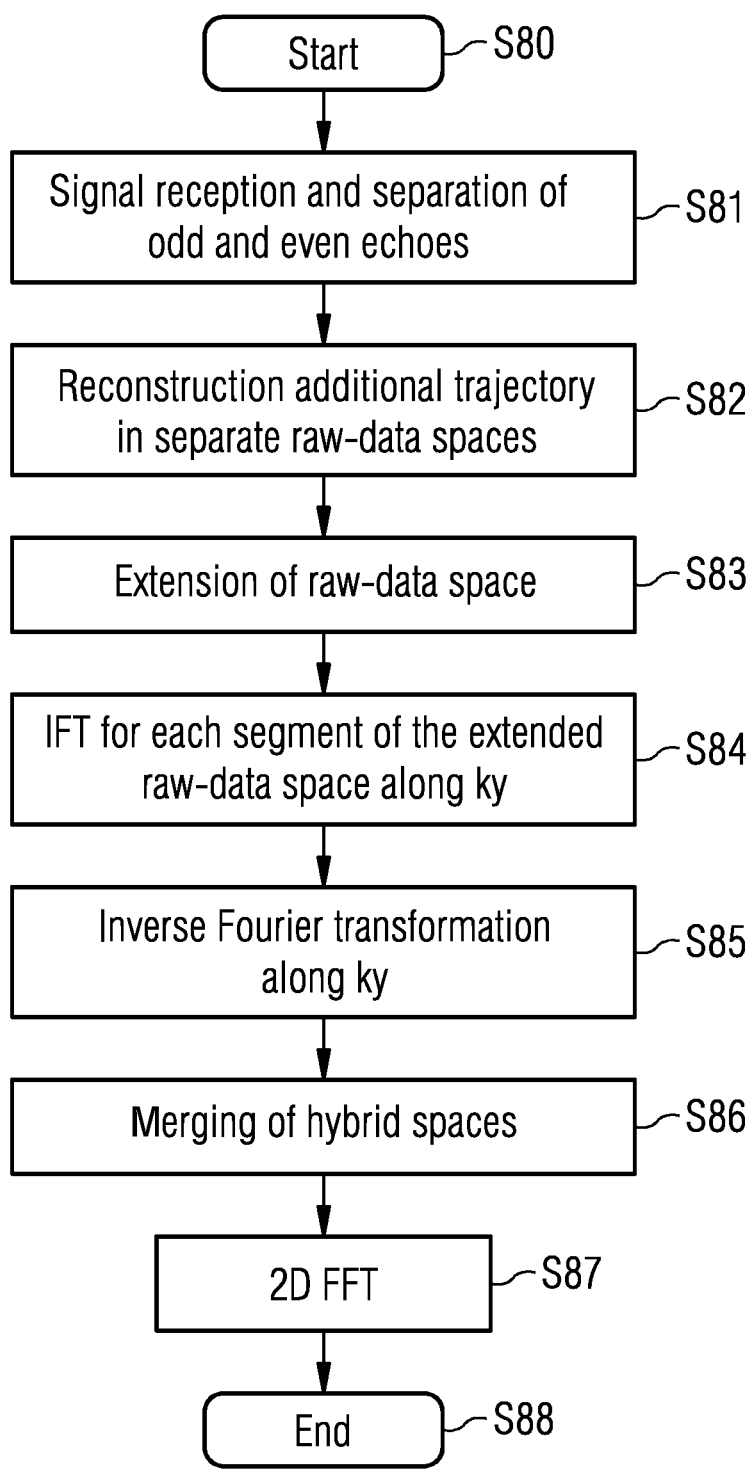
FIG. 8 is a flowchart for artifact-free reconstruction of MR images by extension of the raw-data space in the readout direction in accordance with the invention.

The method is summarized in FIG. 8. The method starts in step S80 and in step S81 zigzag-type segments of a trajectory are recorded, wherein following signal recording, the raw dataset is divided into even and odd echoes. The signal recording is performed such that the maximum signal intensity, the center of the signal echoes, is shifted, preferably by a quarter of the recorded raw-data space, in the direction of the readout axis. In step S82, an additional trajectory is recorded for the even and odd recorded raw-data points in each case using a parallel recording technique. In step S83, the raw-data space is extended in the readout direction, as was described in connection with FIGS. 4, 6 and 7. Then, in step S84, an iFT is performed each for each segment of the extended raw-data space along the phase-encoding direction. This means that an iFT is performed for example for the segment 71 in FIG. 6 and separately for the extension segment 75 or for the segment 51 in FIG. 4 and separately therefrom for the segment 55. Following this step S84 and the iFT, there is now a part-transformed raw-data space and a part-transformed extension segment. Part-transformed means that a Fourier transform was performed only along one direction, namely along the phase-encoding direction. In step S85, the part-transformed raw-data space and the part-transformed extension segment are now used to apply an inverse Fourier transform back into the raw-data space (inverse Fourier transform in the phase-encoding direction). After step S85, this results in a hybrid space and a hybrid extension segment. In step S86, the elements generated in step S85, the hybrid space and the hybrid extension segment are merged to form a total hybrid space. Following the merging of the data in step S86, in step S87 the Fourier transform can, as known, be performed to create the at least one MR image. The method ends in step S88.

The above-described method makes it possible to apply a method such as is known from parallel imaging with EPI data recorded on a zigzag trajectory. Herein, it is possible to use the iFT with which the even and odd echoes are phase-corrected individually so that they lie on Cartesian coordinates. This enables the achievement of higher acceleration factors and better image quality. It is also possible to perform partial-Fourier acquisition in the kx direction, which further reduces the acquisition time.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for operating a magnetic resonance (MR) apparatus, comprising:
    operating an MR data acquisition scanner to execute an echo-planar MR data acquisition sequence in which signal echoes are acquired by applying readout gradients along a readout axis, kx, and phase-encoding gradients along a phase-encoding axis, ky, with said signal echoes being entered asymmetrically into a memory organized as raw-data space yielding a zigzag-type undersampled trajectory such that said signal echoes are shifted in the raw-data space to cause a raw-data center associated with the raw-data space to be offset from a geometric center of the raw-data space with respect to the kx and ky axes, the shift in the raw data space being limited to a maximum of a quarter of the raw-data space in a direction of said readout axis;
    in a computer, reconstructing an additional zigzag-type trajectory in the raw-data space by executing a parallel imaging reconstruction algorithm using the zigzag-type trajectory of the acquired signal echoes; and
    in said computer, reconstructing at least one MR image from the acquired signal echoes in the raw-data space, using an interlaced Fourier transform and said additional zigzag-type trajectory.

2. A method as claimed in claim 1 comprising, before reconstructing said at least one MR image, extending raw-data points represented by said signal echoes in the raw-data space to form an extension segment, using a point symmetry of the raw-data space with respect to the center of raw-data space, and thereby producing an extended raw-data space comprising said raw-data space and said extension segment, with raw data in said extension segment being calculated using point reflection with respect to said center of the raw-data space.

3. A method as claimed in claim 2 comprising shifting said signal echoes in said direction of said readout axis by a quarter of the raw-data space, wherein said extension segment is in said direction of the readout axis.

4. A method as claimed in claim 2, further comprising:
applying said interlaced Fourier transform to said signal echoes in the raw-data space to produce a hybrid space;
applying said interlaced Fourier transform to said extension segment to produce a hybrid extension segment;
merging said hybrid space and said hybrid extension segment to produce a total hybrid space; and
subjecting said total hybrid space to a Fourier transform along said readout axis to produce said at least one MR image.

5. A method as claimed in claim 2 wherein said at least one MR image has a resolution, and wherein a recording time required for acquiring said at least one MR image with said resolution is reduced by not filling the raw-data space completely with raw data that would be necessary for obtaining said resolution, but which corresponds to said extended raw-data space with said extension segment.

6. A method as claimed in claim 2 comprising recording said at least one MR image with a defined recording time, with raw data recorded in said defined recording time, without using said extension segment, being used to reconstruct an MR reference image with a defined resolution, said at least one MR image being reconstructed with said interlaced Fourier transformation using said extension segment so as to give said at least one MR image a higher resolution than said defined resolution.

7. A method as claimed in claim 1 comprising shifting said signal echoes along said readout axis only by an amount that makes a spacing of said zigzag-type undersampled trajectory, relative to the reconstructed additional zigzag-type trajectory, in a direction of the phase-encoding axis of said phase-encoding gradients, smaller than one sampling step in the ky-direction ($\Delta ky$).

8. A method as claimed in claim 1 comprising reconstructing said additional zigzag-type trajectory using a Generalized Autocalibrating Partially Parallel Acquisition (GRAPPA) reconstruction algorithm.

9. A method as claimed in claim 1 comprising reconstructing said additional zigzag-type trajectory so that an incline of a last segment of said reconstructed zigzag-type trajectory is opposite, in a positive direction of said phase-encoding gradients, to an incline of a last segment of the acquired zigzag-type trajectory.

10. A method as claimed in claim 1, further comprising:
prior to reconstructing said at least one MR image, extending raw-data points represented by said signal echoes in the raw-data space to form an extension segment; and
shifting said signal echoes in said direction of said readout axis by a quarter of the raw-data space,
wherein said extension segment is in said direction of the readout axis.

11. A method as claimed in claim 1, further comprising:
prior to reconstructing said at least one MR image, extending raw-data points represented by said signal echoes in the raw-data space to form an extension segment;
applying said interlaced Fourier transform to said signal echoes in the raw-data space to produce a hybrid space; and
applying said interlaced Fourier transform to said extension segment to produce a hybrid extension segment.

12. A method as claimed in claim 11, further comprising:
merging said hybrid space and said hybrid extension segment to produce a total hybrid space; and
subjecting said total hybrid space to a Fourier transform along said readout axis to produce said at least one MR image.

13. A method as claimed in claim 1, wherein an average spacing between adjacent points of the raw-data space in a phase-encoding direction satisfies the Nyquist criterion.

14. A magnetic resonance (MR) apparatus comprising:
an MR data acquisition scanner;
a computer configured to operate said MR data acquisition scanner to execute an echo-planar MR data acquisition sequence in which signal echoes are acquired by applying readout gradients along a readout axis, kx, and phase-encoding gradients along a phase-encoding axis, ky, with said signal echoes being entered asymmetrically into a memory organized as raw-data space yielding a zigzag-type undersampled trajectory such that said signal echoes are shifted in the raw-data space to cause a raw-data center associated with the raw-data space to be offset from a geometric center of the raw-data space with respect to the kx and ky axes, the shift in the raw data space being limited to a maximum of a quarter of the raw-data space in a direction of said readout axis;
said computer being configured to reconstruct an additional zigzag-type trajectory in the raw-data space by executing a parallel imaging reconstruction algorithm using the zigzag-type trajectory of the acquired signal echoes; and
said computer being configured to reconstruct at least one MR image from the acquired signal echoes in the raw-data space, using an interlaced Fourier transform and said additional zigzag-type trajectory.

15. A non-transitory, computer-readable data storage medium encoded with programming instructions, said storage medium being loaded into a computer of a magnetic resonance (MR) apparatus comprising an MR data acquisition scanner, and said programming instructions causing said computer to:
operate said MR data acquisition scanner execute an echo-planar MR data acquisition sequence in which signal echoes are acquired by applying readout gradients along a readout axis, kx, and phase-encoding gradients along a phase-encoding axis, ky, with said signal echoes being entered asymmetrically into a memory organized as raw-data space yielding a zigzag-type undersampled trajectory such that said signal echoes are shifted in the raw-data space to cause a raw-data center associated with the raw-data space to be offset from a geometric center of the raw-data space with respect to the kx and ky axes, the shift in the raw data space being limited to a maximum of a quarter of the raw-data space in a direction of said readout axis;
reconstruct an additional zigzag-type trajectory in the raw-data space by executing a parallel imaging reconstruction algorithm using the zigzag-type trajectory of the acquired signal echoes; and
reconstruct at least one MR image from the acquired signal echoes in the raw-data space, using an interlaced Fourier transform and said additional zigzag-type trajectory.

\* \* \* \* \*